United States Patent [19]
Yamamoto et al.

[11] Patent Number: 5,907,572
[45] Date of Patent: *May 25, 1999

[54] TWO-DIMENSIONAL SURFACE LIGHT EMITTING ELEMENT ARRAY

[75] Inventors: Masateru Yamamoto; Izumi Iwasa; Shigeyuki Otake; Akira Sakamoto, all of Ebina, Japan

[73] Assignee: Fuji Xerox Co. Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/739,753

[22] Filed: Oct. 29, 1996

[30] Foreign Application Priority Data

Nov. 8, 1995 [JP] Japan ................... 7-289569

[51] Int. Cl.$^6$ .................................. H01L 27/14
[52] U.S. Cl. ............................ 372/50; 357/32
[58] Field of Search ...................... 372/50.452, 26, 372/36; 313/495–497; 340/771; 250/213 A; 357/32, 17

[56] References Cited

U.S. PATENT DOCUMENTS

| | | | |
|---|---|---|---|
| 4,445,132 | 4/1984 | Ichikawa et al. | 357/32 |
| 5,031,187 | 7/1991 | Orenstein et al. | 372/50 |
| 5,095,200 | 3/1992 | Matsuda et al. | 250/213 A |
| 5,212,472 | 5/1993 | Takahashi et al. | 340/771 |
| 5,222,071 | 6/1993 | Pezeshki et al. | 372/26 |
| 5,325,386 | 6/1994 | Jewell et al. | 372/50 |
| 5,365,533 | 11/1994 | Groussin | 372/50 |
| 5,654,607 | 8/1997 | Yamaguchi et al. | 313/495 |

OTHER PUBLICATIONS

IEEE Photonics Technology Letters, vol. 6, No. 8, Aug. 1994, "Two–Dimensional Matrix Addressed Vetical Cavity Top–Surface Emitting Laser Array Display", R.A. Morgan et al., pp. 913–917.

*Primary Examiner*—Rodney Bovernick
*Assistant Examiner*—Ellen Eunjoo Kang
*Attorney, Agent, or Firm*—Oliff & Berridge, PLC

[57] ABSTRACT

Column wirings are divided into at least two groups of first column wirings and second column wirings. Image data corresponding to different rows in one frame are supplied to these groups of column wirings at the single timing. At the same timing, row signals are applied to the different wirings at e.g. j=1 and j=17. Rows and columns can be replaced by each other.

8 Claims, 18 Drawing Sheets

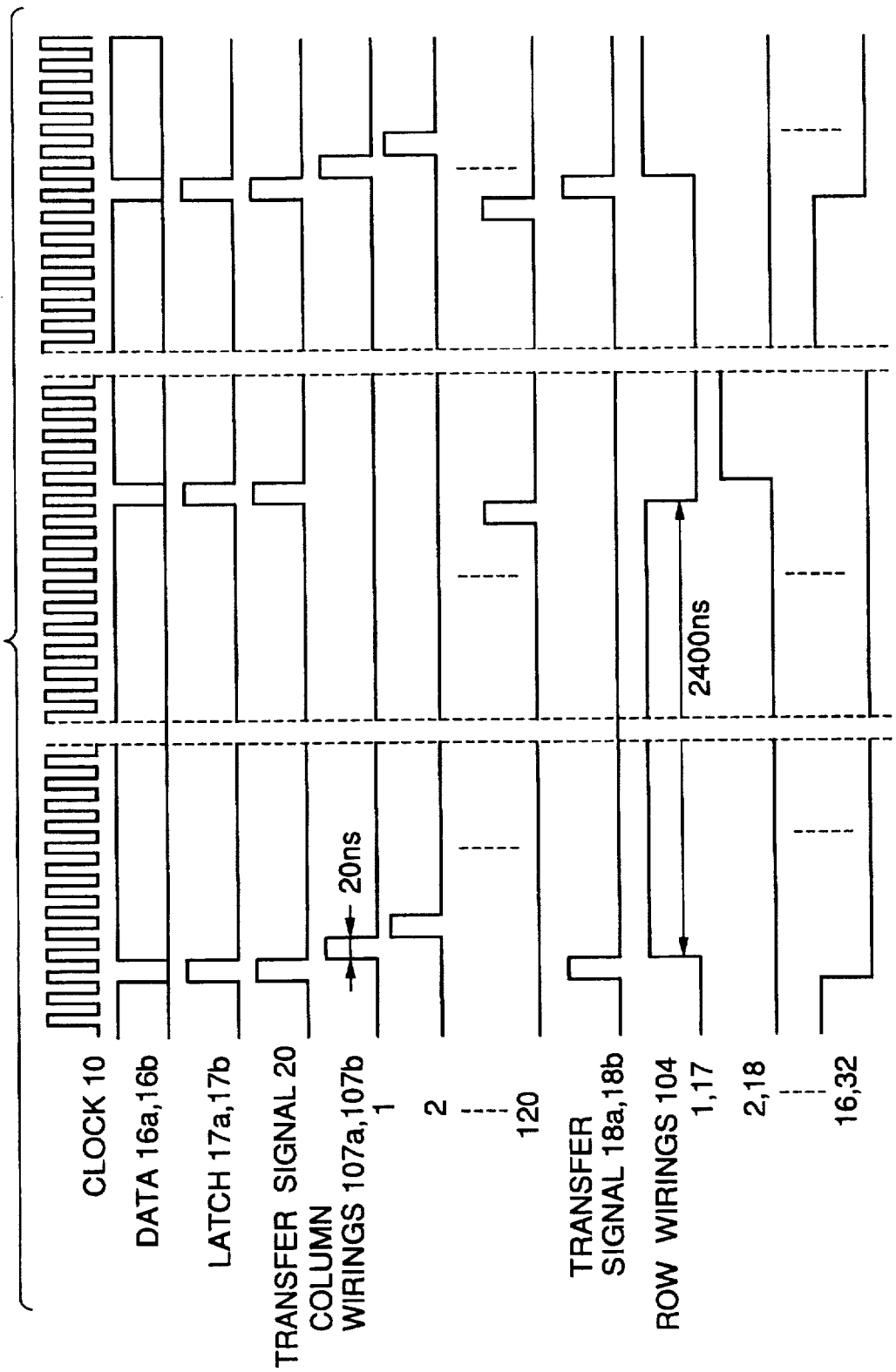

FIG.15
RELATED ART

TWO-DIMENSIONAL SURFACE LIGHT EMITTING ELEMENT ARRAY

BACKGROUND OF THE INVENTION

The present invention relates to a two-dimensional surface light emitting element array and a method and apparatus for driving it, and more particularly to a two-dimensional surface light emitting element array capable of shortening a time required for patterned light emission of one frame and reducing power consumption on signal wirings to restrict generation of heat and a method and apparatus for driving it.

One example of previously known two-dimensional surface light emitting element arrays in a matrix wiring format is disclosed as a two-dimensional surface light emitting laser array in e.g. "PHOTONICS TECHNOLOGY LETTERS" issued 1994, Vol. 6, pages 913 to 917. FIG. 11 shows such a two-dimensional surface light emitting laser array composed of vertical resonator type surface light emitting laser elements 102 arranged in a two-dimensional array on a semi-insulating semiconductor substrate 101. Each of the surface light emitting semiconductor lasers 102 is provided with an anode electrode 103 having an opening 103a. The anode electrode 103 is connected to a row wiring 104 having a row pad 105 at its end. A cathode electrode is connected to a column wiring 107 on the semiconductor substrate 101. The column wiring 107 is connected to a column pad 108. The respective columns of the two-dimensional surface light emitting lasers 102 arranged in an array are isolated by high resistance layers 109 formed by ion-implantation.

In the configuration described above, the row wirings 104 are selected in order by a clock signal. When the voltage corresponding to an image data is applied to column wirings 107 in synchronism with this, a light emission pattern corresponding to the image signal can be obtained.

FIG. 12 shows a two-dimensional surface light emitting laser array in a matrix wiring format having n×m (32×120=3840) surface light emitting lasers 102. In this array, 3840 surface light emitting lasers 102 are arranged at the intersecting points of 32 lines of row wirings 104 and 120 lines of column wirings 107.

FIG. 13 shows a driving apparatus for making patterned light emission of the two-dimensional light emission laser array. The driving apparatus includes first 12 (twelve) shift registers 11 for receiving image data 16 serially simultaneously on the basis of the clock 10, 12 (twelve) latch circuits 12 for receiving the image data from the first shift registers 11 simultaneously in parallel on the basis of a latch signal 17, 12 (twelve) drivers 13 connected to a power supply Vss, each of them serving to supply driving signals to corresponding 10 (ten) column wirings 107 in accordance with the image data latched in the latch circuit 12, a second shift register 14 for shifting a transfer signal 18 on the basis of the clock 10, a selector 15 connected to power source Vcc for selecting a row wiring 104 on the basis of the shifting position of the transfer signal 18 in the second shift register 14, and 3840 surface light emitting lasers 102 arranged at the intersecting points of the row wirings 104 and the column wirings 107, each represented by a resistance R and a laser diode LD.

FIG. 14 shows operation timings of driving the two-dimensional surface light emitting laser array. Using clock 10, the image data of ten bits are simultaneously supplied to each of the first twelve shift registers 11. Thus, the image data 16 having a total of 120 bits are allotted to the 120 column wirings 107. By the latch signal 17, the image data are latched in the latch circuit 12. At the same timing as the latch signal 17, the transfer signal 18 is produced and supplied to the second shift register 14. When the transfer signal 18 is located at the first bit of the second shift register 14, the selector 15 selects the row wiring 104 at j=1 by producing a select signal. Then, the driver 13 supplies the column wirings 107 from i=1 to i=120 in accordance with the image data latched in the twelve latch circuits 12. As a result, on the row wiring 104 at j=1, the surface light emitting laser(s) 102 having received the driving signal "1" through the column wiring(s) 107 emit(s) light whereas the surface light emitting laser(s) 102 having received the driving signal "0" does not emit light. The duration of such an operation is 20 ns.

Next, the transfer signal 18 is shifted to the second bit position of the second shift register 14. Simultaneously, the subsequent 120 bits image data 16 are supplied to the first registers 11 and latched in the latch 12. Therefore, the selector 15 selects the row wiring 104 at j=2. The driver 13 causes the surface light emitting laser (s) on the selected row wiring 104 to emit light. In this way, the row wirings 104 are selected sequentially from j=1 to j=32 so that display of the light emission pattern of one frame is completed.

In the above operation, since the surface light emitting lasers 102 are sequentially driven in a time-divisional manner for a duration of 20 ns, the time T taken for the light emission pattern of one frame is T=3840×20 ns/120

=640 ns

FIG. 15 shows another driving device for driving the two-dimensional surface light emitting laser array as shown in FIG. 12 to make patterned light emission. This driving device is different from the driving device shown in FIG. 13 in that it further comprises a third shift register 19 for shifting a second transfer signal 20 on the basis of the clock 10 for divisional driving of the column wirings 107 and AND circuits 21 arranged in a pattern of divisional driving and taking a logical product of the outputs from the third shift register 19 and latch circuit 12 so that it is supplied to the driver 13.

FIG. 16 shows operation timings of driving the two-dimensional surface light emitting laser array shown in FIG. 12 by the driving device shown in FIG. 15. First, the row wiring 104 at j=1 is selected for a duration of 200 ns. The column wirings 107 at i=1 to 120 are divided into ten groups of wirings each having twelve surface light emitting lasers 102, i.e., i=1, 11, . . . 111, i=2, 12, . . . 112, . . . . . . i=10, 20, . . . 120 in accordance with the shifting position of the transfer signal 20 in the third shift register 19. In the above duration of 200 ns, each group of wirings is driven for a duration of 20 ns. Next, the row wiring 104 at j=2 is selected. Likewise, the column wirings 107 are driven in a divisional manner. In this way, the row wirings to j=32 are selected sequentially. By the selection of each of the row wirings 104, the surface light emitting lasers 102 are driven divisionally on the basis of divisional driving of the column wirings 107. Thus, patterned light emission of one frame is performed.

In the above operation, since for each of the row wirings 104, ten groups each having twelve two-dimensional surface light emitting lasers 102 are driven divisionally, the time T required to obtain one frame patterned light emission is T=3840×20 ns/12

=6.4 μs

FIG. 17 shows another driving device for driving the two-dimensional surface light emitting laser array as shown in FIG. 12 to make patterned light emission. This driving device is different from the driving device shown in FIG. 15 in that it further comprises a third shift register 19 for shifting a second transfer signal 20 on the basis of the clock 10 and AND circuits 21 arranged in a pattern of divisional driving and taking a logical product of the outputs from the third shift register 19 and latch circuit 12 so that it is supplied to the driver 13, and in that in this configuration, by the selection of each of the row wirings 104 at j=1 to 32, the column wirings 107 at i=1 to 120 are divided into 120 so that the surface light emitting lasers 102 are driven one by one.

FIG. 18 shows operation timings of driving the two-dimensional surface light emitting laser array shown in FIG. 12 by the driving device shown in FIG. 17. First, the row wiring 104 at j=1 is selected for a duration of 2400 ns. The column wirings 107 at i=1 to 120 are divided into 120 sets of wirings each having a single surface light emitting lasers 102, i.e., i=1, 1=2, . . . . . . 120 in accordance with the shifting position of the transfer signal 20 in the third shift register 19. In the above duration of 2400 ns, each wiring is driven for a duration of 20 ns. Next, the row wiring at j=2 is selected. Likewise, the column wirings 107 are driven. In this way, the row wirings 104 to j=32 are selected sequentially. By the selection of each of the row wirings 104, the surface light emitting lasers 102 are driven divisionally on the basis of divisional driving of the column wirings 107. Thus, patterned light emission of one frame is performed.

In the above operation, since for each of the row wirings 104, each of the surface light emitting lasers 102 is driven sequentially, the time T required to obtain one frame light emission is T=3840×20 ns/1

=76.8 μs

However, when the conventional matrix shape two-dimensional surface light emitting laser array is driven by the driving apparatus of FIG. 13, for the selected row wiring, all the corresponding surface light emission lasers connected to the selected row wiring are driven simultaneously so that the heat generated from adjacent laser elements influence on each other to deteriorate the element characteristic. In order to obviate this inconvenience, the divisional driving by the driving devices of FIGS. 15 and 17 can be proposed. Such driving, however, reduce the number of the surface light emitting lasers driven in time division, thus lengthening the time required for one frame. The power consumed in the row wirings and column wirings results in the sum of the product of the number of the surface light emitting lasers driven in time division and the resistances of the column wirings and the product of the square of the number and the resistances of the row wirings. Development of the high density two-dimensional surface light emitting element array is limited by increase of power consumption and heat generation.

SUMMARY OF THE INVENTION

Therefore, an object of the present invention is to provide a two-dimensional surface light emitting element array capable of shortening the time required for patterned light emission of one frame and a driving method and apparatus therefor.

Another object of the present invention is to provide a two-dimensional light emission element array capable of reducing power consumed on signal wirings, and a driving method and apparatus therefor.

In order to attain the above object, there is provided a two-dimensional surface light emitting element array comprising:

a wiring matrix including a first wiring group of plural electrodes arranged in parallel to each other, a second wiring group of plural electrodes arranged in parallel to each other and crossing the first wiring group; and plural surface light emitting elements connected to respective electrodes of said first wiring group and said second wiring group and arranged two-dimensionally at the intersecting points of said first wiring group and said second wiring group, wherein at least one of said first wiring group and said second wiring group includes plural groups of electrodes separated electrically in a wiring direction of the electrodes; and the electrodes of one of said electrode groups are provided with an external connection section for driving said surface light emitting elements connected to the electrodes individually from the surface light emitting elements connected to the electrodes of the remaining electrode groups.

BRIEF DESCRIPTION OF THE DRAWINGS

FIG. 5 is a timing chart showing a method of driving a two-dimensional light emission array according to the first embodiment (one-by-one driving of elements).

FIG. 15 is a block diagram showing a device for driving the conventional two-dimensional surface emitting laser array in a matrix wiring (simultaneous driving of spaced elements).

DETAILED DESCRIPTION OF THE PREFERRED EMBODIMENTS

Figure 1A:
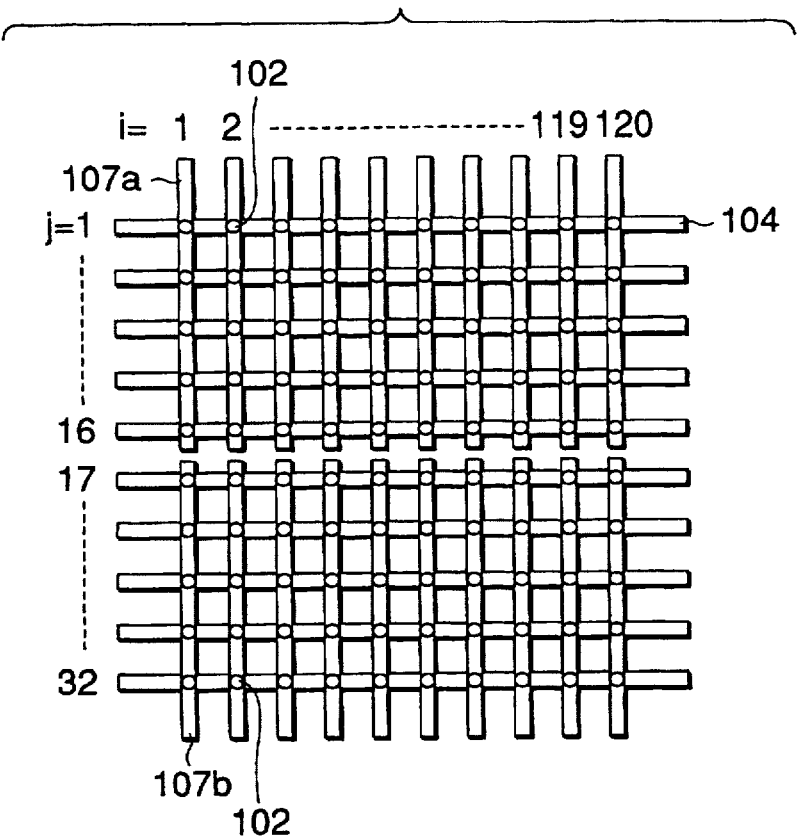
FIG. 1A is a view showing the two-dimensional surface light emitting element array in a matrix wiring according the first embodiment of the present invention.
Figure 1B:
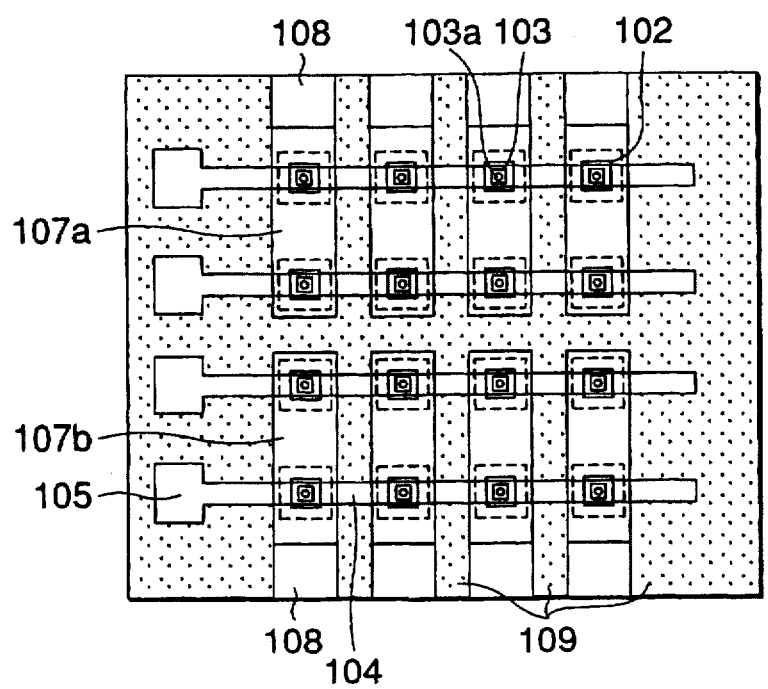
FIG. 1B is a plan view thereof.
Figure 11:
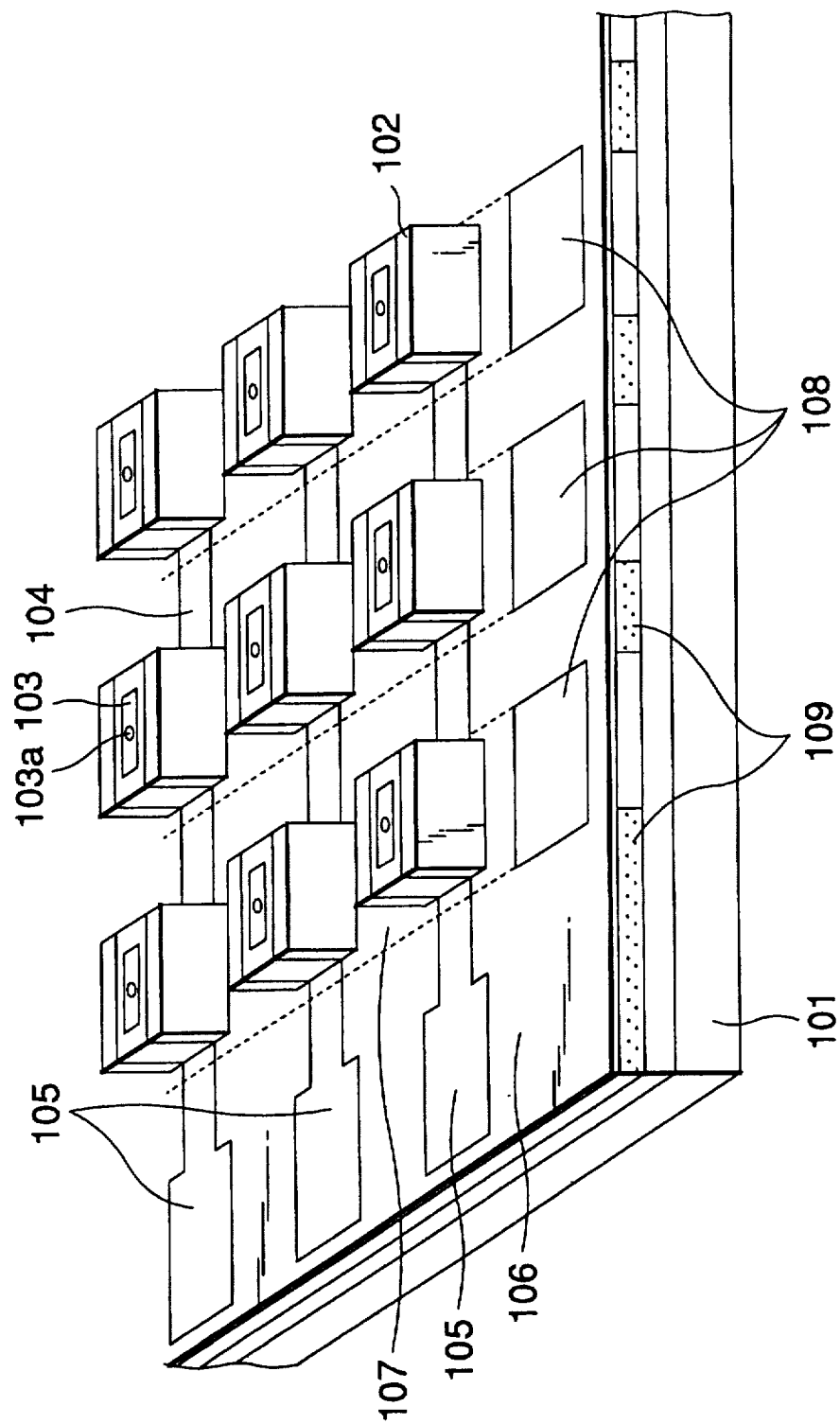
FIG. 11 is a perspective view for explaining a conventional two-dimensional surface light emitting laser array in a matrix wiring.

FIG. 1A shows a two dimensional surface light emitting laser array in matrix wiring according to the first embodiment of the present invention. The array is composed of 32 (j=1–32) row wirings 104 and column wirings 107a and 107b each having 120 lines (i=1 to 120). The row wirings 104 and the column wirings 107a and 107b are arranged to cross each other. The interval between the adjacent wirings is 150 μm. At the intersecting points of the row wirings and column wirings, the surface light emitting lasers 102 are arranged two-dimensionally. Their anodes (not shown) are connected to the row wirings 104, whereas their cathodes (not shown) are connected to the column wirings 107a and 107b. The column wirings 107a and 107b are separated between the row wirings 104 at j=16 and j=17. The surface light emitting lasers 102 have a spot diameter of 5 μm. FIG. 1B shows a planar view of the two-dimensional surface light emitting laser array with the number of elements reduced. In FIG. 1, like reference numerals refer to like parts in FIG. 11. It should be noted that the insulating films 106 are not shown.

Figure 2:
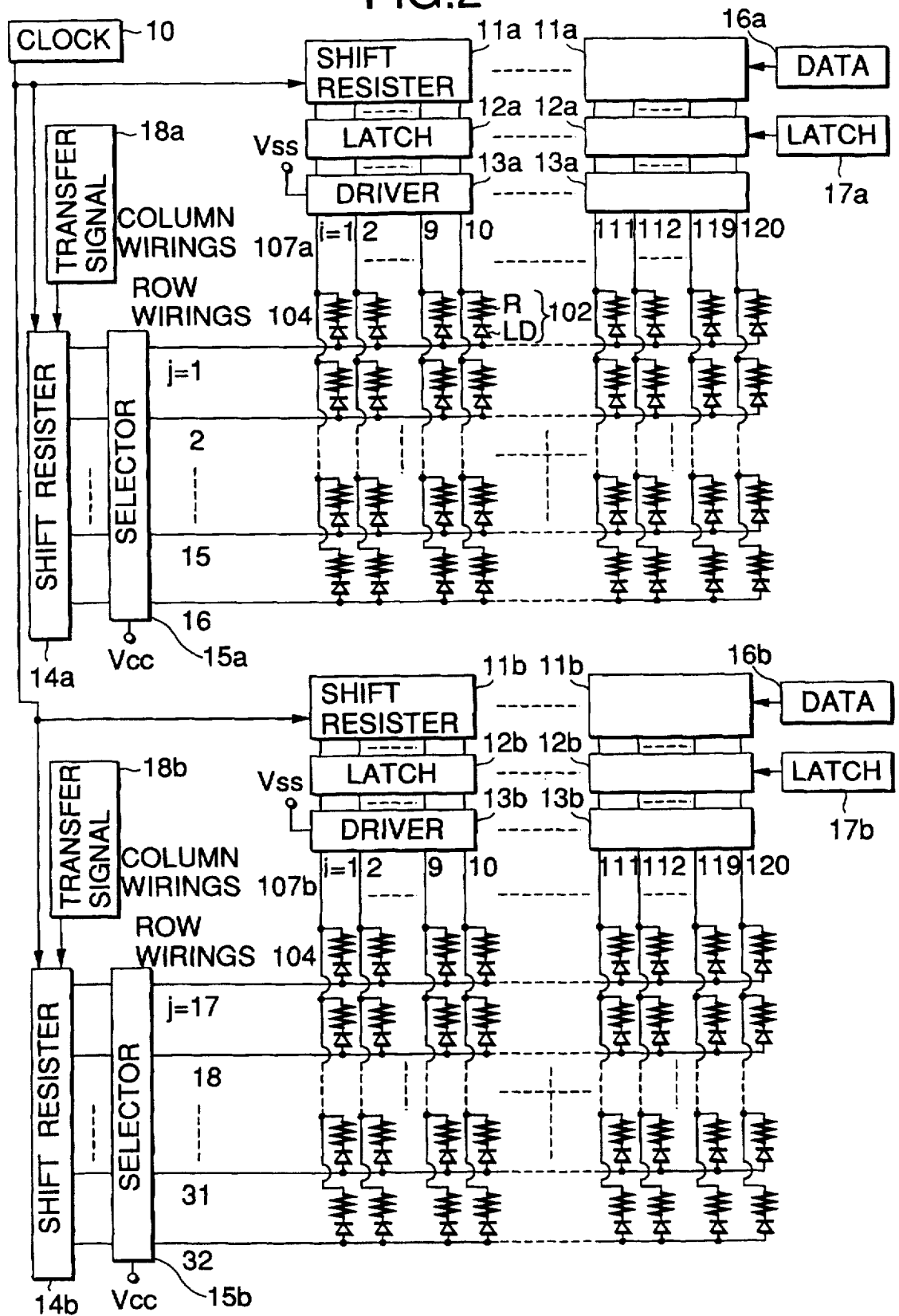
FIG. 2 is a block diagram of a driving device of the two-dimensional surface light emitting element array according to the first embodiment of the present invention.

FIG. 2 shows a driving device for making patterned light-emission of the two-dimensional surface light emitting laser array. This driving device includes first 12 (twelve) shift registers 11a for receiving image data 16a serially simultaneously on the basis of the clock 10; 12 (twelve) latch circuits 12a for simultaneously receiving the image data from the first shift registers 11a on the basis of a latch signal 17a; 12 (twelve) drivers 13a connected to voltage source Vss, each for supplying driving signals to the corresponding column wirings 107a in accordance with the image data latched in each of the latch circuits 12a; a second shift register 14a for shifting a transfer signal 18a on the basis of the clock 10; a selector 15a connected to power source Vcc for selecting one of row wirings 104 at j=1 to 16 on the basis of the shift position of the transfer signal 18a in the second shift register 14a; and 1920 surface light emitting lasers 102 arranged at the intersecting points of the row wirings 104 at j=1 to 16 and the column wirings 107a, each represented by R and LD. This driving device further includes third 12 (twelve) shift registers 11b for receiving image data 16b serially simultaneously on the basis of the clock 10; 12 (twelve) latch circuits 12b for simultaneously receiving the image data from the third shift registers 11b on the basis of a latch signal 17b; 12 (twelve) drivers 13b connected to voltage source Vss, each for supplying driving signals to the corresponding column wirings 107b in accordance with the image data latched in each of the latch circuits 12b; a fourth shift register 14b for shifting a transfer signal 18b on the basis of the clock 10; a selector 15b connected to power source Vcc for selecting one of row wirings 104 at j=17 to 32 on the basis of the shifting position of the transfer signal 18b in the fourth shift register 14b; and 1920 surface light emitting lasers 102 arranged at the intersecting points of the row wirings 104 at j=17 to 32 and the column wirings 107b, each represented by R and LD.

Figure 3:
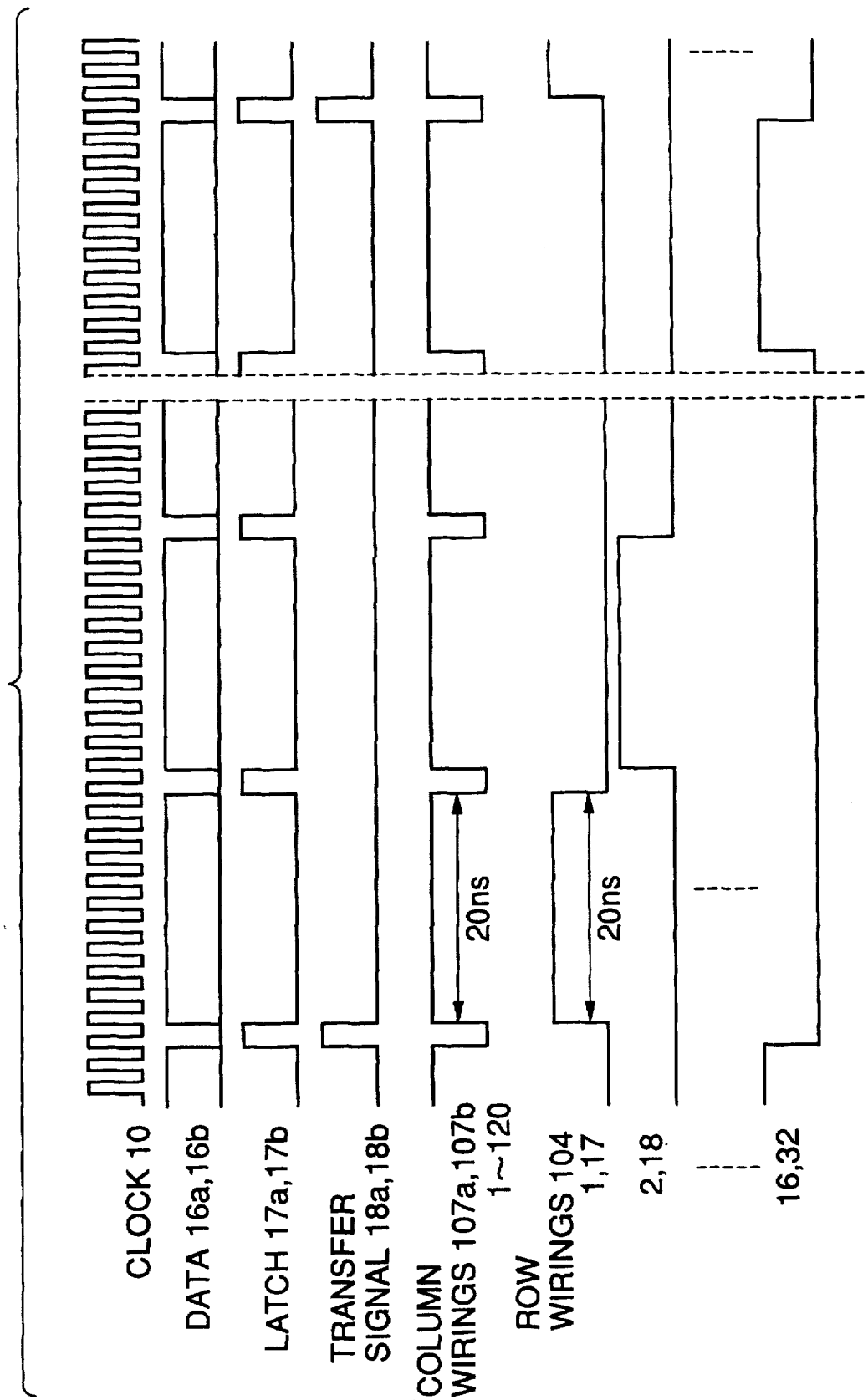
FIG. 3 is a timing chart showing a method of driving a two-dimensional surface light emitting element array according to the first embodiment (driving of all the elements on a single line).

FIG. 3 shows operation timings of driving the two-dimensional surface light emitting laser array of FIG. 1. In response to the clock 10, the image data 16a and 16b each having ten bits are simultaneously supplied to each of the first shift registers 11a and of the third shift registers 11b (twelve for each), respectively. Thus, the image data 16a, 16b each having a total of 120 bits are allotted to the column wirings 107a, 107b (120 for each), respectively. In response to the latch signals 17a, 17b, the image data 16a, 16b are latched in the latch circuits 12a, 12b. When the transfer signal 18a, 18b, supplied at the same timing as that of the latch signals 17a, 17b, are located at the first bit of each of the second and fourth shift registers 14a and 14b, the selector 15a, 15b produce select signals to select the row wiring at j=1, j=17. The drivers 13a, 13b supply driving signals to the column wirings 107a, 107b at i=1 to i=120 in accordance with the image data 16a, 16b latched in each of the 12 latch circuits 12a, 12b. As a result, on the row wirings 104 at j=1 and j=17, the surface light emitting lasers 102 having received the driving signal of "1" through the column wirings 107a, 107b at j=1 and j=17 emit light whereas the surface light emitting lasers 102 having the driving signal of "0" do not emit light. The duration for driving is 20 ns.

Next, the transfer signals 18a and 18b are shifted to the second bit of each of the second and fourth shift registers 14a and 14b, respectively. At the same time, the subsequent image data 16a and 16b each having 120 bits are supplied to the first and third shift registers 11a and 11b and latched in the latch circuits 12a and 12b, respectively. The selectors 15a and 15b select the row wirings 104 at j=2 and j=18, and the drivers 13a and 13b cause the surface light emitting lasers 102 on the selected wirings 104 to emit light in accordance with the image data 16a and 16b, respectively. In this way, the row wirings at j=1 to j=16 and j=17 to j=32 are selected sequentially to complete display of the light emission pattern of one frame.

In the above operation, since 120×2=240 elements of the surface light emitting lasers 102 are driven simultaneously for a duration of 20 ns, the time T required to obtain the light emission pattern of one frame is expressed by T=3840×20 ns/240

=320 ns

Figure 4:
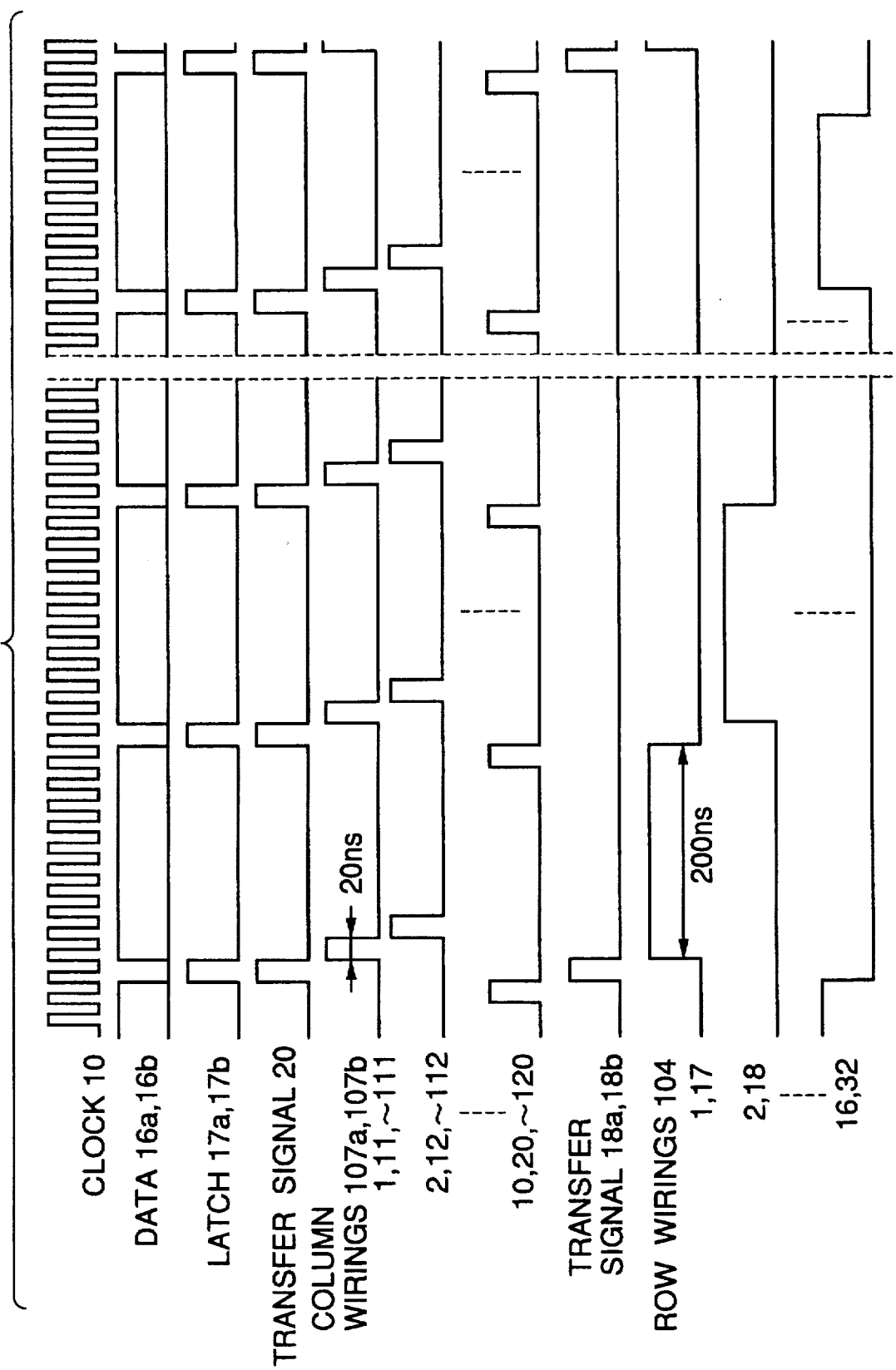
FIG. 4 is a timing chart showing a method of driving a two-dimensional surface light emitting element array according to the first embodiment (simultaneous driving of spaced elements).
Figure 15:
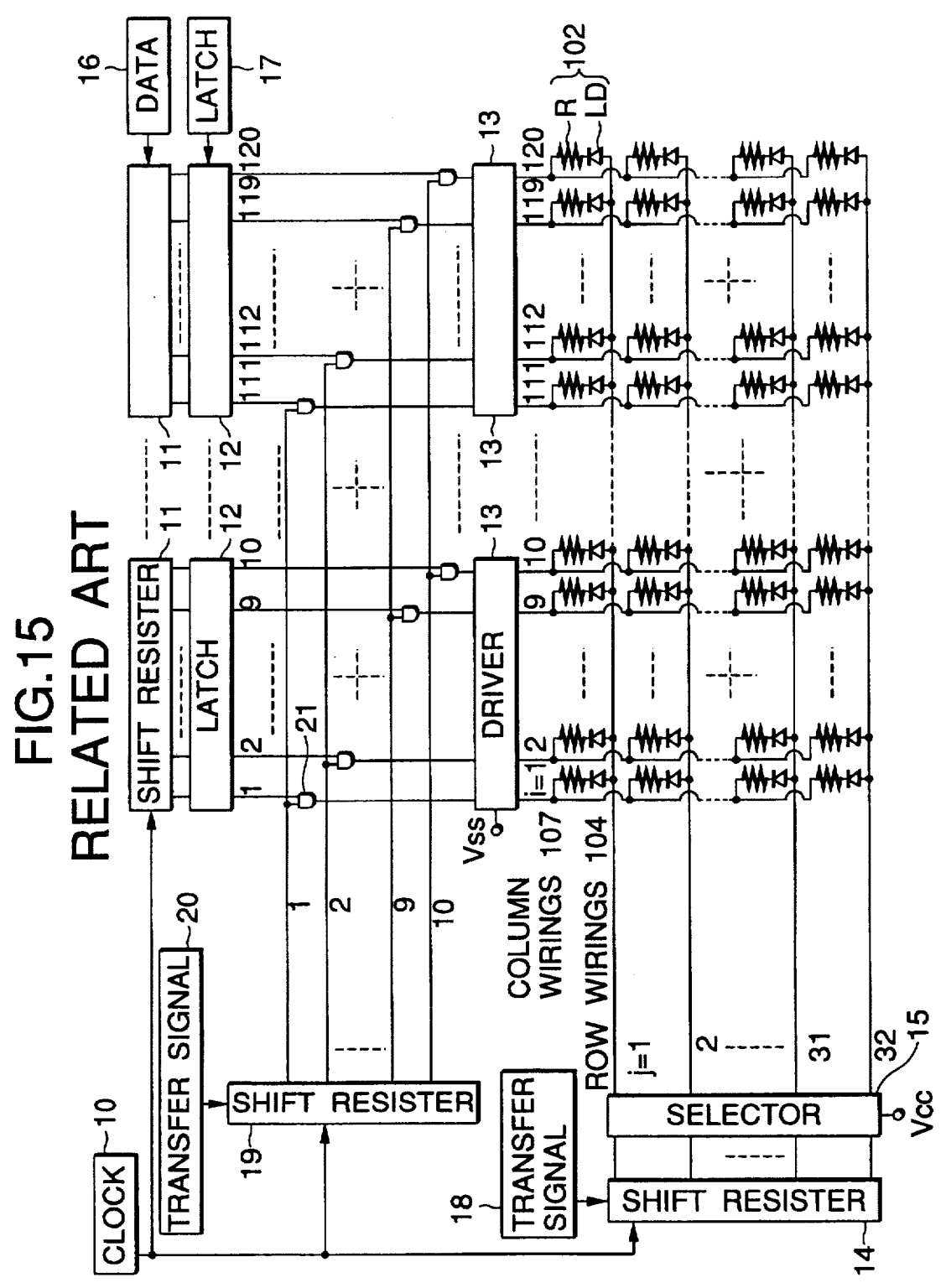

FIG. 4 shows operation timings of the driving device provided with a combination of a shift register and an AND circuit (combination of the shift register 19 and the AND circuits 21 shown in FIG. 15) which serve to select every twelve column wirings 107a, 107b, at the front stage of driver 13a, 13b. First, in selection of the row wirings at j=1 and j=17, by the transfer signal 20, the column wirings 107a, 107b at i=1, 11, . . . . . . 111 every ten columns are selected to drive a total of 24 surface light emitting lasers 102. Subsequently, in accordance with the shifting position of the transfer signal 20, the column wirings 107a and 107b from i=2, 12, ...... 112 to i=10, 20 ...... 120 are selected to drive a total of 24 for each selection of the column wirings. Likewise, the same operation will be carried out until the row wirings 104 at j=16 and j=32 are selected.

In the above operation, 12×2=24 elements of the surface light emitting lasers 102 are driven simultaneously for a duration of 20 ns. The time T required to obtain the light emission pattern of one frame is expressed by T=3840×20 ns/24

=3200 ns=3.2 $\mu s$

Figure 17:
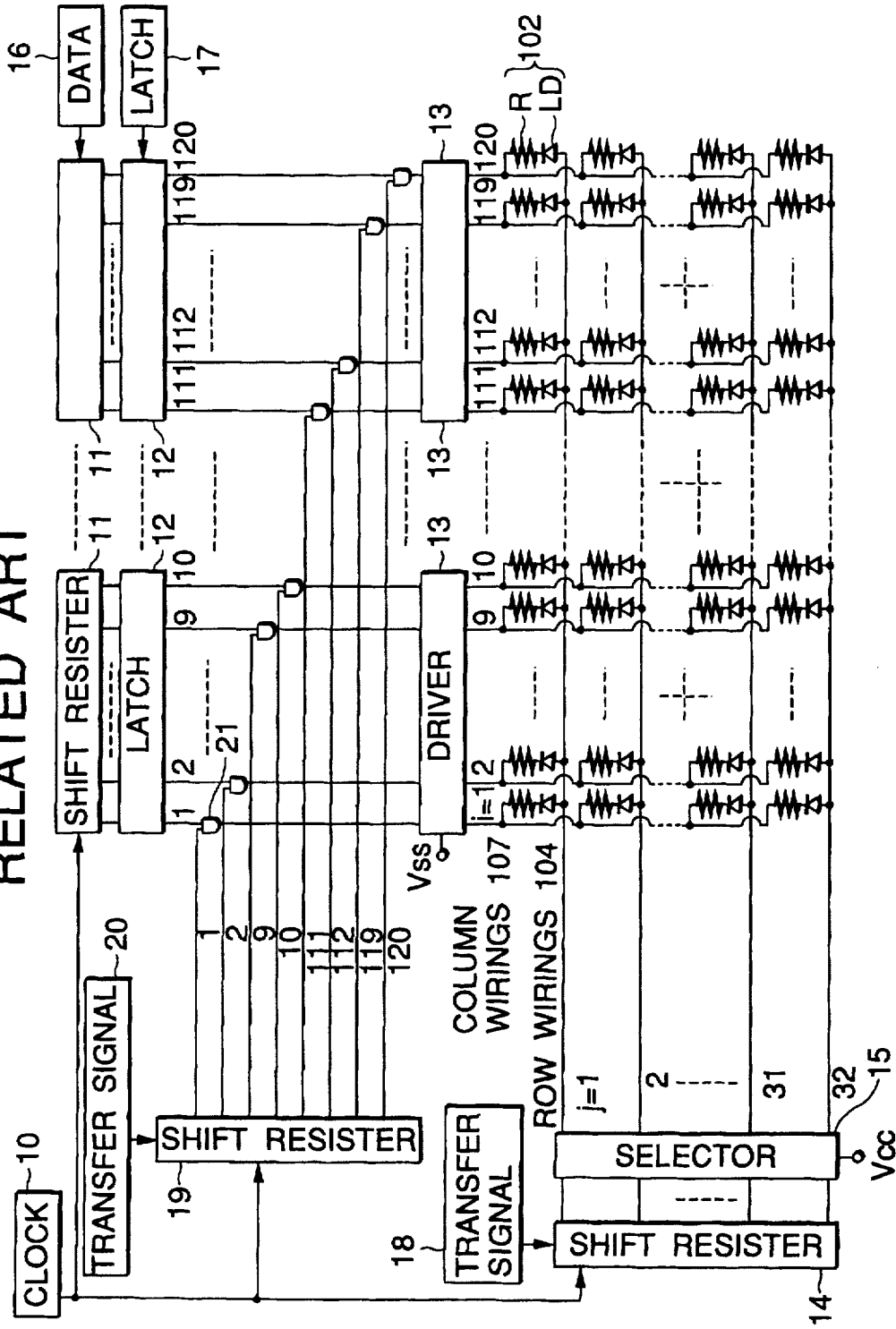
FIG. 17 is a block diagram showing a device for driving the conventional two-dimensional surface light emitting laser array in a matrix wiring (one-by-one driving of elements).
Figure 18:
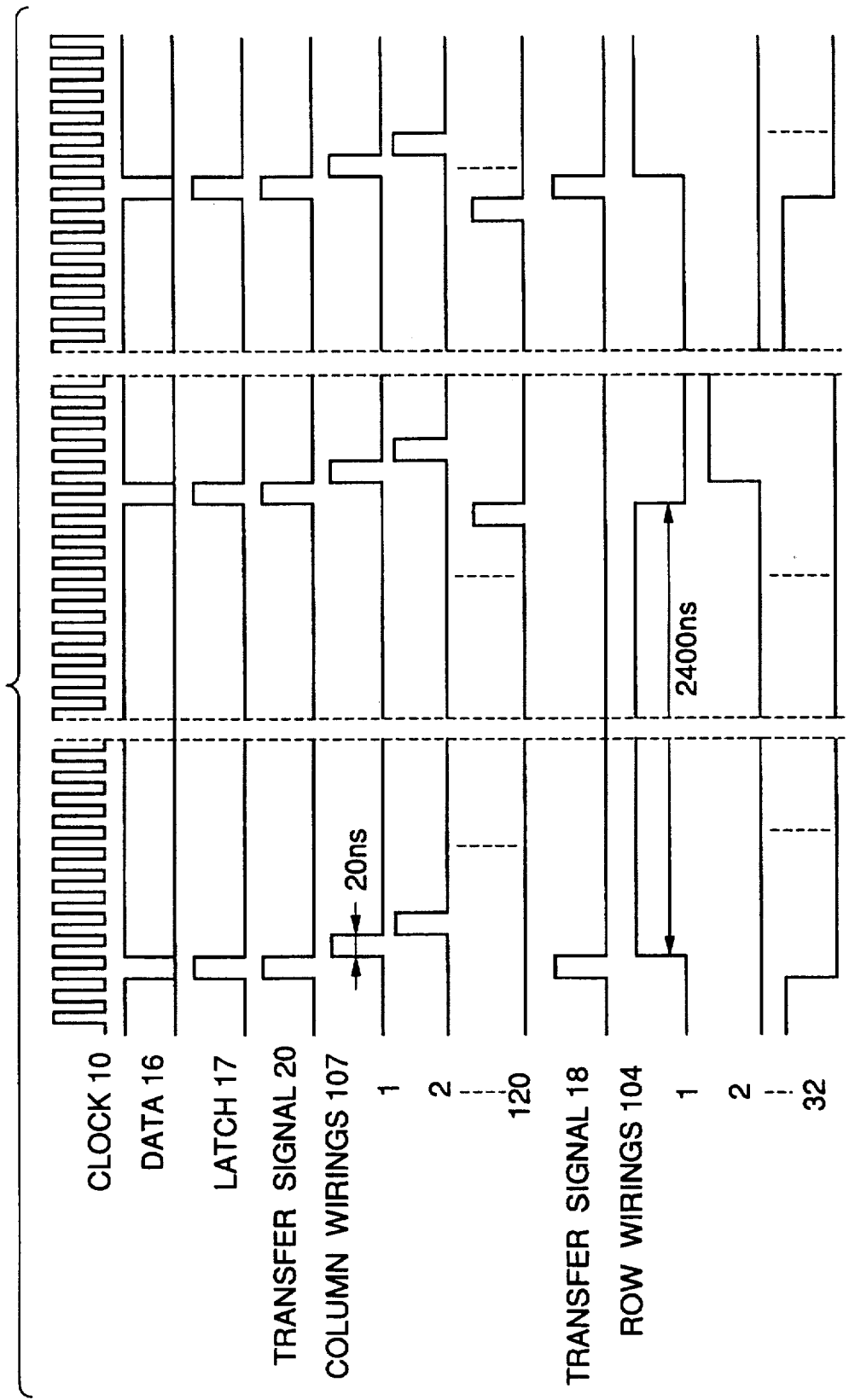
FIG. 18 is a timing chart showing a method for driving the conventional two-dimensional surface light emitting laser array in a matrix wiring (one-by-one driving of elements).

FIG. 5 shows operation timings of the driving device provided with a combination of a shift register and an AND circuit (combination of the shift register 19 and the AND circuit 21 shown in FIG. 17) which serve to select every one column wiring 107a, 107b, at the front stage of driver 13a, 13b. First, by the transfer signal 20, the column wiring 107a, 107b at i=1 is selected to drive two light emission lasers 102. Subsequently, in accordance with the shifting position of the transfer signal 20 in the shift register, the column wirings 107a, 107b from i=2 to i=120 are selected to drive 2 surface light emitting lasers for each selection of the column wirings. Likewise, the manner of selecting the row wirings 104 is the same as the example of FIG. 4.

In the above operation, the two elements of the surface light emitting lasers 102 are driven simultaneously for a duration of 20 ns. The time T required to obtain the light emission pattern of one frame is expressed by T=3840×20 ns/2

=38,400 ns=38. 4 $\mu s$

When the two dimensional surface light emitting laser array shown in FIG. 1 is driven by the driving method shown in the operation timings shown in FIGS. 3, 4 and 5, the column wirings are divided into two parts 107a and 107b. Therefore, the time T required for light emission pattern of one frame is half as long as the case when the column wirings are not divided.

Figure 6A:
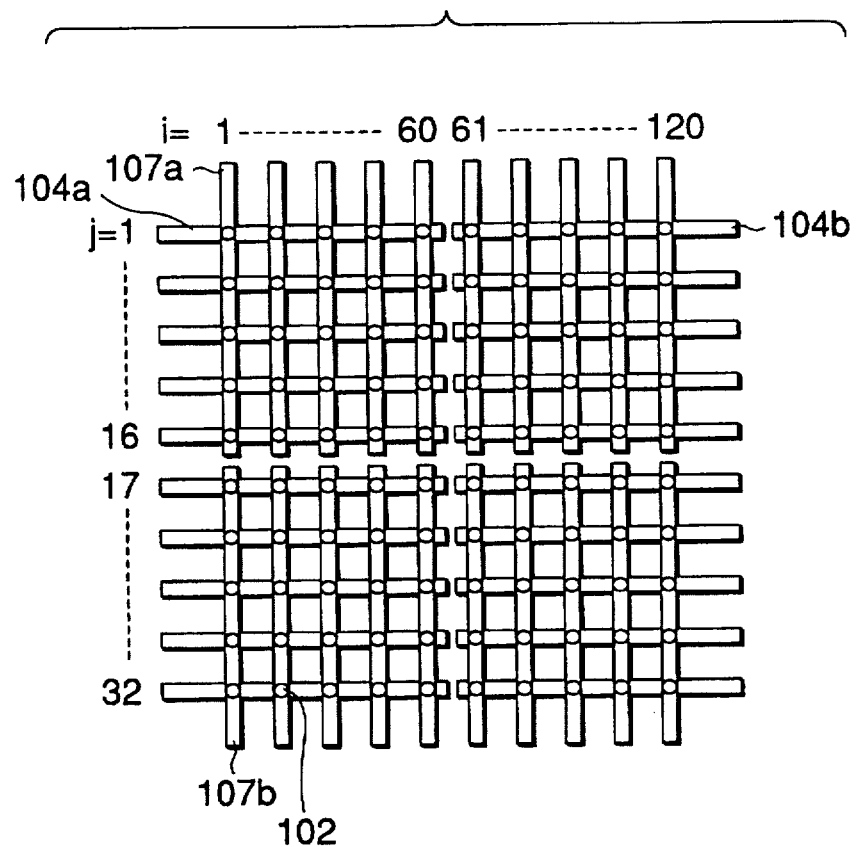
FIG. 6A is a view showing the two-dimensional surface light emitting element array in a matrix wiring according the second embodiment of the present invention.
Figure 6B:
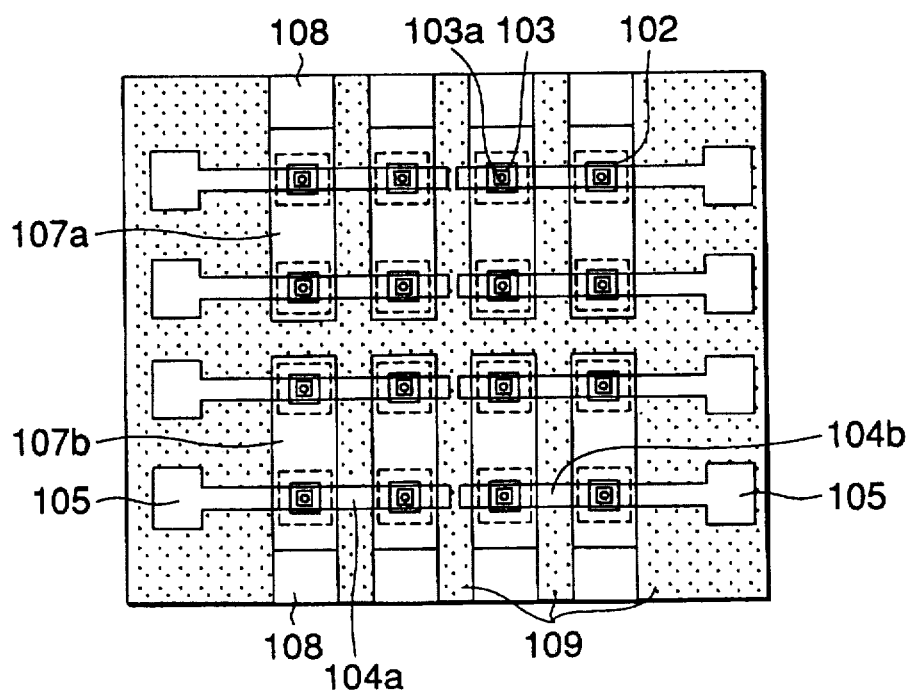
FIG. 6B is a plan view thereof.

FIG. 6A shows a two-dimensional surface light emitting laser array in a matrix wiring according to the second embodiment of the present invention which is divided into four parts, row wirings 104a and 104b each having 32 lines (j=1 to 32) and column wirings 107a and 107b each having 120 lines (i=1 to 120). The row wirings 104a, 104b and the column wirings 107a, 107b are arranged to cross each other. The interval between the adjacent wirings is 150 $\mu m$. At the intersecting points of the row wirings and column wirings, the surface light emitting lasers 102 are arranged two-dimensionally. The row wirings 104a, 104b are connected to the anodes (not shown) of the surface light emitting lasers 102, whereas the column wirings 107a, 107b are connected to their cathodes (not shown). The two-dimensional light emission lasers 102 have a spot diameter of 5 $\mu m$. FIG. 6B shows a planar view of the two-dimensional surface light emitting laser array with the number of elements reduced. In FIG. 6B, like reference numerals refer to like parts in FIG. 1B.

Figure 7:
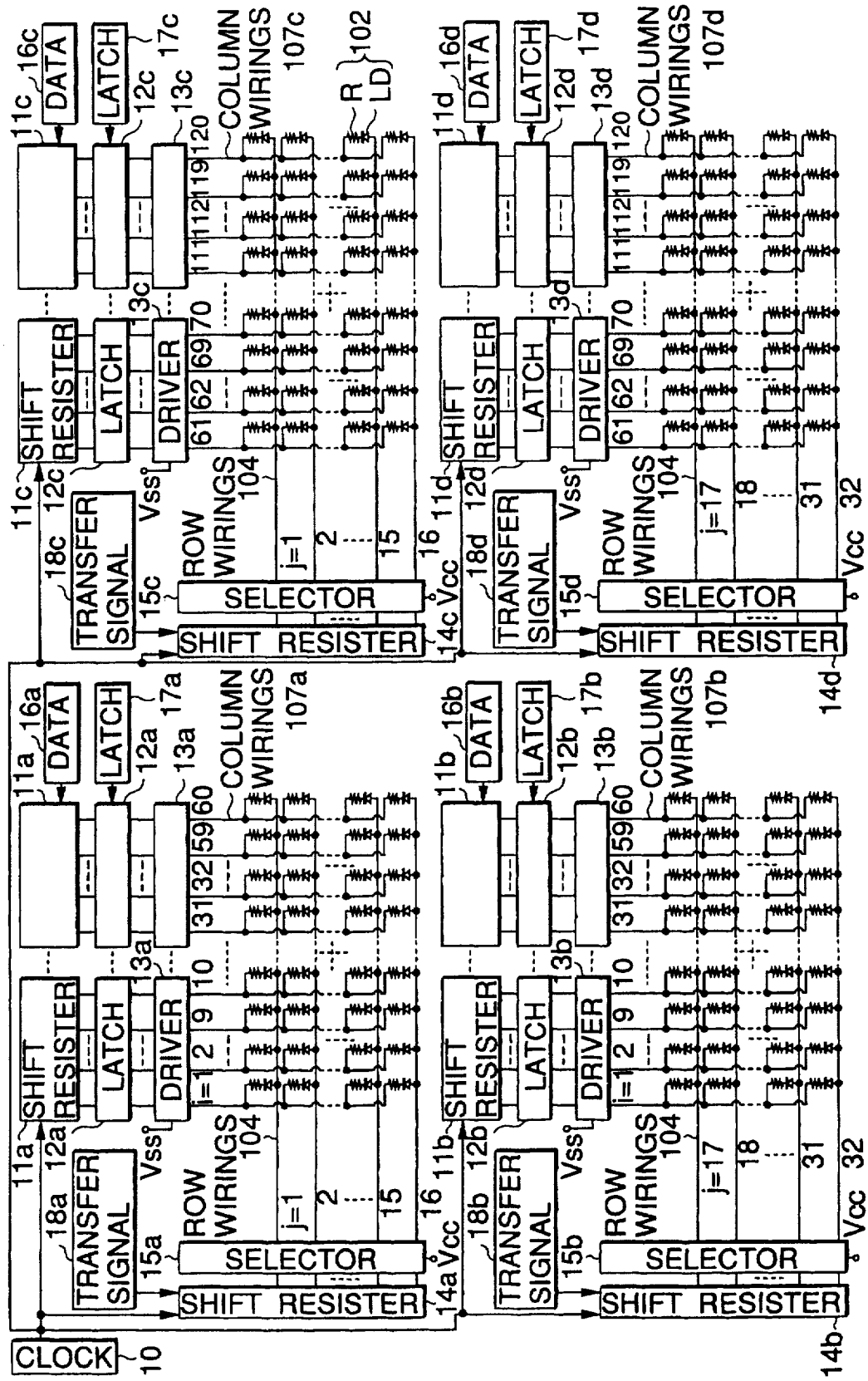
FIG. 7 is a block diagram of a driving device of the two-dimensional surface light emitting element array according to the second embodiment of the present invention.
Figure 13:
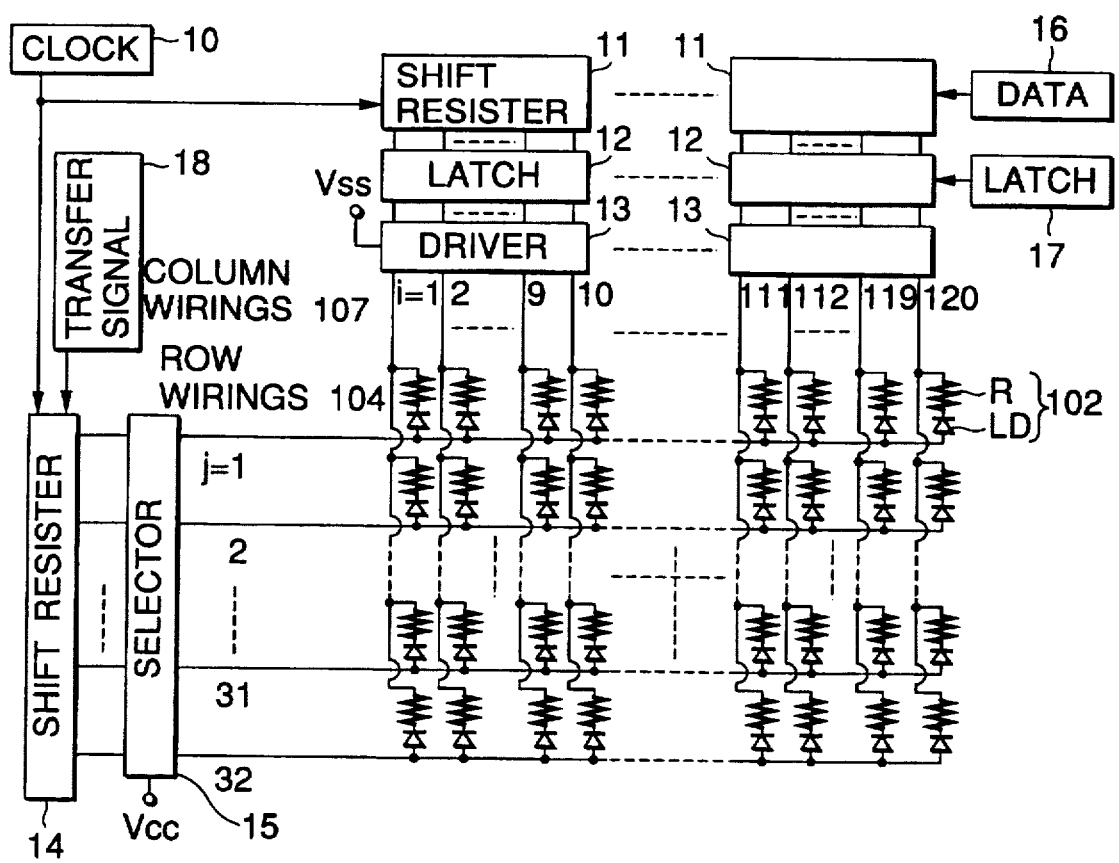
FIG. 13 is a block diagram showing a method of driving the conventional two-dimensional surface light emitting laser array in a matrix wiring (simultaneous driving of all the elements on a single line).

FIG. 7 shows a driving device for making patterned light-emission of the two-dimensional surface light emitting laser array shown in FIG. 6. This driving device includes four driving circuits which are operated by the common clock 10. Like the driving circuit of FIG. 13, the driving circuits includes first to fourth shift registers 11a to 11d (six for each) for receiving image data 16a to 16d serially simultaneously on the basis of the clock 10; latch circuits 12a to 12d (six for each) for receiving the image data simultaneously in parallel from the first to fourth shift registers 11a to 11d on the basis of latch signals 17a to 17d; drivers 13a to 13d (six for each) connected to voltage source Vss, each for supplying driving signals to the corresponding 10 (ten) column wirings 107a, 107b in accordance with the image data latched in each of the latch circuits 12a to 12d; a fifth to eighth shift register 14a to 14d for shifting transfer signals 18a to 18d on the basis of the clock 10; selectors 15a to 15d connected to power source Vcc for selecting one of row wirings 104a, 104b on the basis of the shift position of the transfer signals 18a to 18d in the fifth to eighth shift registers 14a to 14d; and the surface light emitting lasers 102 arranged at the intersecting points of the row wirings 104a, 104b and the column wirings 107a, 107b.

Figure 8:
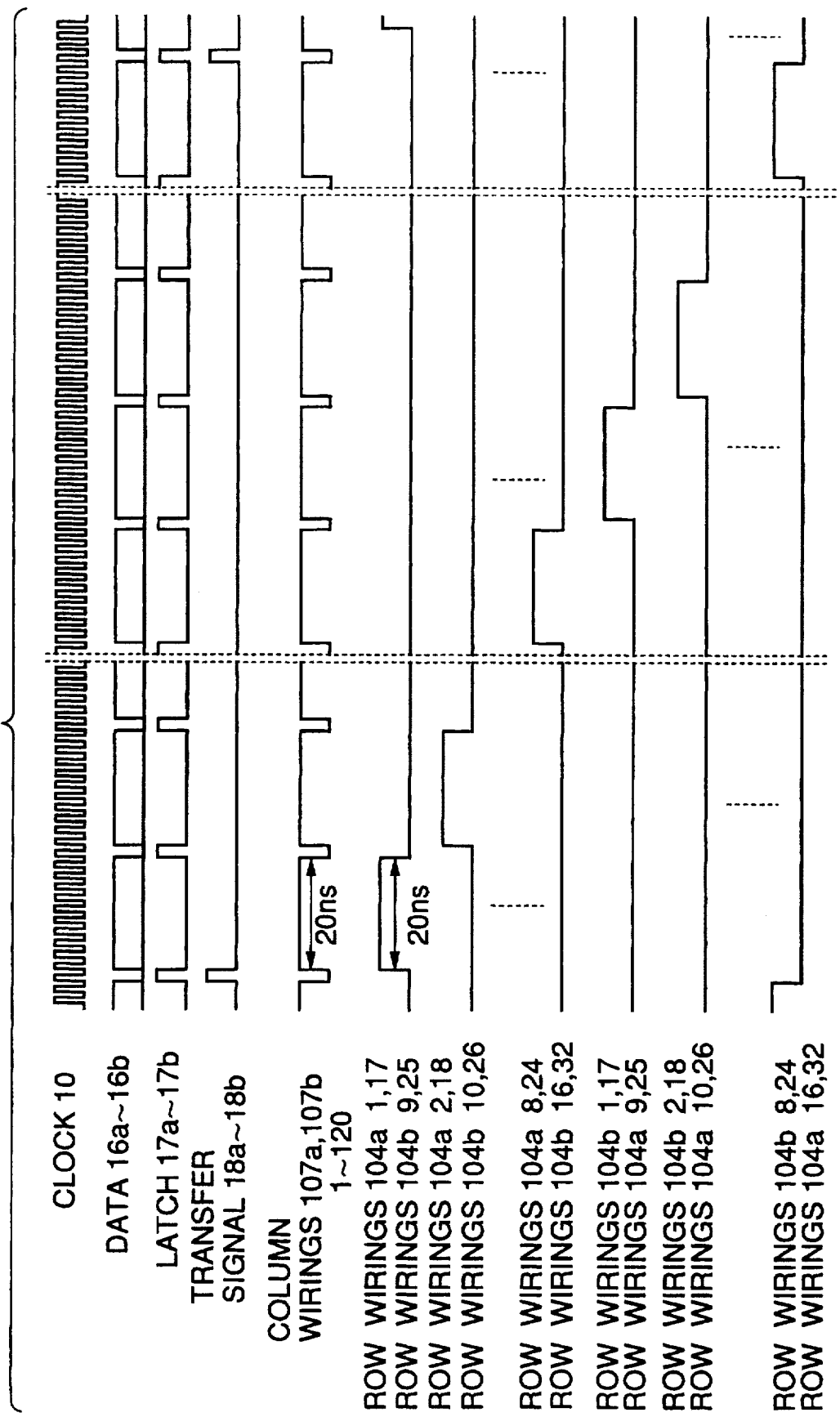
FIG. 8 is a timing chart showing a method of driving a two-dimensional surface light emitting element array according to the second embodiment (driving of all the elements on a single line).

FIG. 8 shows operation timings of driving the two-dimensional surface light emitting laser array of FIG. 6. In response to the clock 10, the image data 16a to 16d of ten bits are simultaneously supplied to each of the first to fourth shift registers 11a to 11d (six for each). The image data 16a to 16d each having a total of 60 bits are allotted to the 120 column wirings 107a, 107b, respectively. In response to the latch signals 17a to 17d, the image data 16a to 16d are latched in the latch circuits 12a to 12d. The transfer signal 18a to 18d, supplied at the same timing as that of the latch signals 17a to 17d are supplied to the fifth to eighth shift registers 14a to 14d, respectively. When the transfer signals 18a, 18b are located at the first bit of each of the fifth and sixth shift registers 14a, 14b, and the transfer signals 18c, 18d are located at the ninth bit of each of the seventh and eighth shift registers 14c, 14d, the selectors 15a to 15d produce a select signal to select the row wiring 104a at j=1, j=17, and row wiring 104b at j=9, j=25, respectively. The drivers 13a to 13d (six for each) supply driving signals to the column wirings 107a, 107b at i=1 to i=120 in accordance with the image data 16a to 16d latched in the latch circuits 12a to 12d (six for each). As a result, on the row wirings 104a at j=1 and j=17 and on the row wirings 104b at j=9 and j=25, the surface light emitting lasers 102 having received the driving signal of "1" through the column wirings 107a, 107b emit light whereas the surface light emitting lasers 102 having received the driving signal of "0" do not emit light. The duration for driving is 20 ns.

Next, the transfer signals 18a and 18b are shifted to the second bit of each of the fifth and sixth registers 14a and 14b, respectively, and the transfer signals 18c and 18d are shifted to the tenth bit of each of the seventh and eighth shift registers 14c and 14d, respectively. At the same time, the subsequent image data 16a to 16d each having 60 bits are supplied to the first to fourth shift registers 11a to 11d and latched in the latch circuits 12a to 12d, respectively. The selectors 15a and 15b select the row wirings 104a at j=2 and j=18 whereas the selectors 15c and 15d select the row wirings 104b at j=10 and j=26. The drivers 13a to 13d cause the surface light emitting lasers 102 on the selected wirings 104a and 104b to emit light in accordance with the image data 16a to 16d, respectively. In this way, the driving as shown in the timing chart completes the display of the light emission pattern of one frame.

In the above operation, since 240 elements of the surface light emitting lasers 102 are driven simultaneously for a duration of 20 ns, the time T required to obtain the light emission pattern of one frame is expressed by T=3840×20 ns/240

=320 ns

Figure 9:
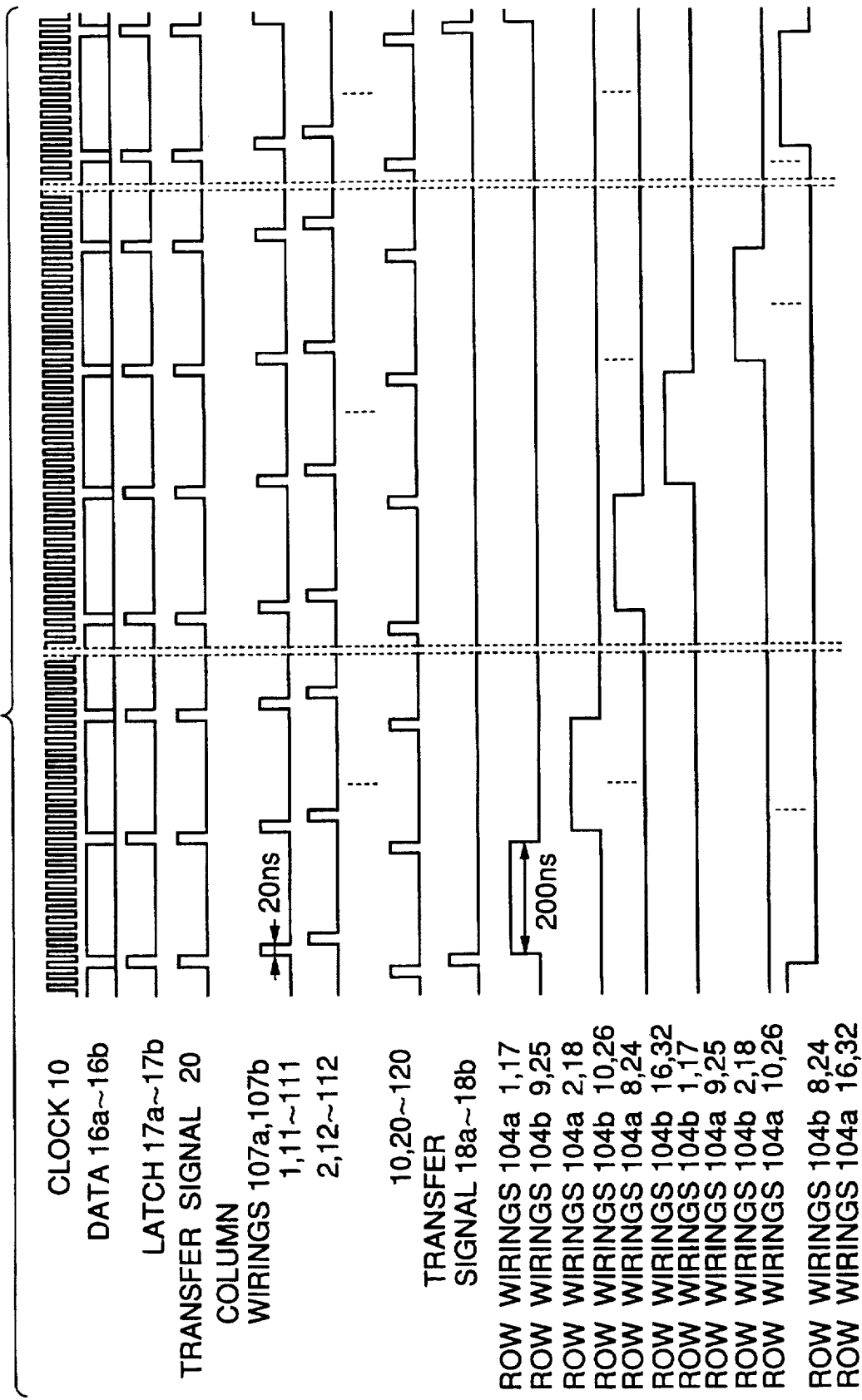
FIG. 9 is a timing chart showing a method of driving a two-dimensional surface light emitting element array according to the second embodiment (simultaneous driving of spaced elements).

FIG. 9 shows operation timings of the driving device provided with a combination of a shift register and an AND circuit (combination of the shift register 19 and the AND circuits 21 shown in FIG. 15) which serve to select every six column wirings 107a, 107b for each driving circuit shown in FIG. 7, at the front stage of drivers 13a to 13d. First, the transfer signals are applied to the row wirings 104a at j=1, 17 and row wirings 104b at j=9, 25. In synchronism with this, individual voltages are applied to every ten column lines at i=1, 11 . . . . . . 111, a total of 24 surface light emitting lasers 102 on the four row wirings are driven individually. Subsequently, the bias voltage is sequentially applied to the column wirings 107a, 107b from 1=2, 12 . . . . . . 112 to i=10, 20 . . . . . . 120. Likewise, the same operation will be carried out for four row wirings sequentially from the row wirings 104a at j=2, 18 and the row wirings 104b at j=10, 26 to the row wirings 104a at j=8, 24 and the row wirings 104b at j=16, 32. Further, the same operation will be carried out for four row wirings sequentially from the row wirings 104b at j=1, 17 and the row wirings 104a at j=9, 25 to the row wirings 104b at j=8, 24 and the row wirings 104a at j=16, 32, thus providing a predetermined light emission pattern.

In the above operation, 6×4=24 elements of the surface light emission lasers 102 are driven simultaneously with a duration of 20 ns. The time T required to obtain the light emission pattern of one frame is expressed by T=3840×20 ns/24

=3200 ns=3.2 $\mu$s

Figure 10:
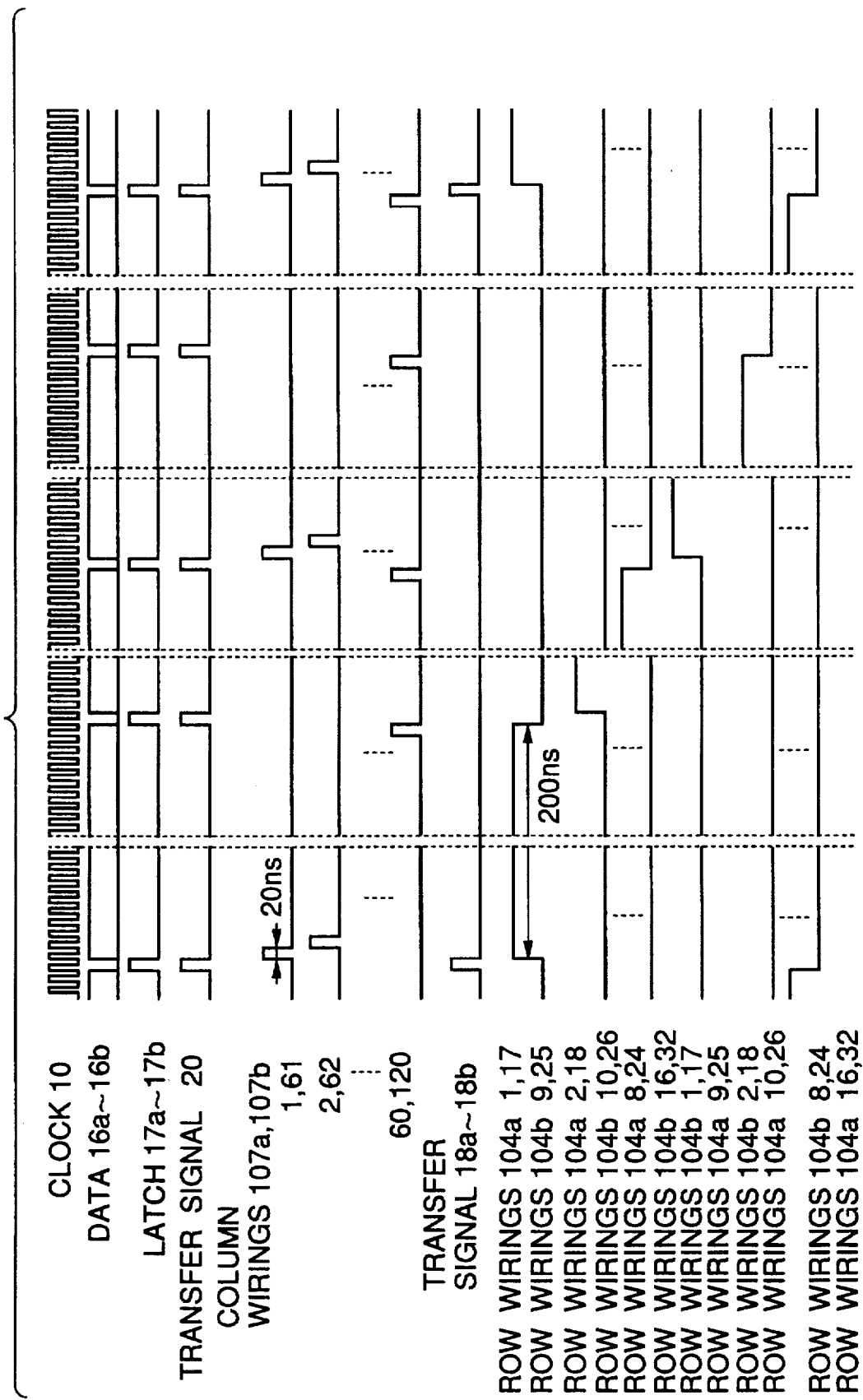
FIG. 10 is a timing chart showing a method of driving a two-dimensional surface light emitting element array according to the second embodiment (one-by-one driving of elements).

FIG. 10 shows operation timings of the driving device provided with a combination of a shift register and an AND circuit (combination of the shift register 19 and the AND circuit 21 shown in FIG. 17) which serve to select every one column wiring 107a, 107b, at the front stage of drivers 13a to 13d. First, the transfer signals are applied to the row wirings 104a at j=1, 17 and row wirings 104b at j=9, 25. In synchronism with this, individual voltages are simultaneously applied to the column wirings 107a, 107b at i=1 and i=61 to drive the four surface light emitting lasers 102 individually. Subsequently, the bias voltage is sequentially applied to the column wirings 107a and 107b from 1=2, i=62 to i=60, 120. Likewise, the same operation will be carried out for four row wirings sequentially from the row wirings 104a at j=2, 18 and the row wirings 104b at j=10, 26 to the row wirings 104a at j=8, 24 and the row wirings 104b at j=16, 32. Further, the same operation will be carried out for four row wirings sequentially from the row wirings 104b at j=1, 17 and the row wirings 104a at j=9, 25 to the row wirings 104b at j=8, 24 and the row wirings 104a at j=16, 32, thus providing a predetermined light emission pattern.

In the above operation, the four elements of the surface light emitting lasers 102 are driven simultaneously for a duration of 20 ns. The time T required to obtain the light emission pattern of one frame is expressed by T=3840×20 ns/4

=19,200 ns=19.2 $\mu$s

When the two dimensional surface light emitting laser array shown in FIG. 6 is driven by the driving method shown in the operation timings shown in FIGS. 8, 9 and 10, the time T required for light emission pattern of one frame is ½ in FIGS. 8 and 9 and ¼ in FIG. 10 as long as the case when the wirings are not divided.

An explanation will be given of the heat generation in the row wirings and the column wirings.

Figure 12:
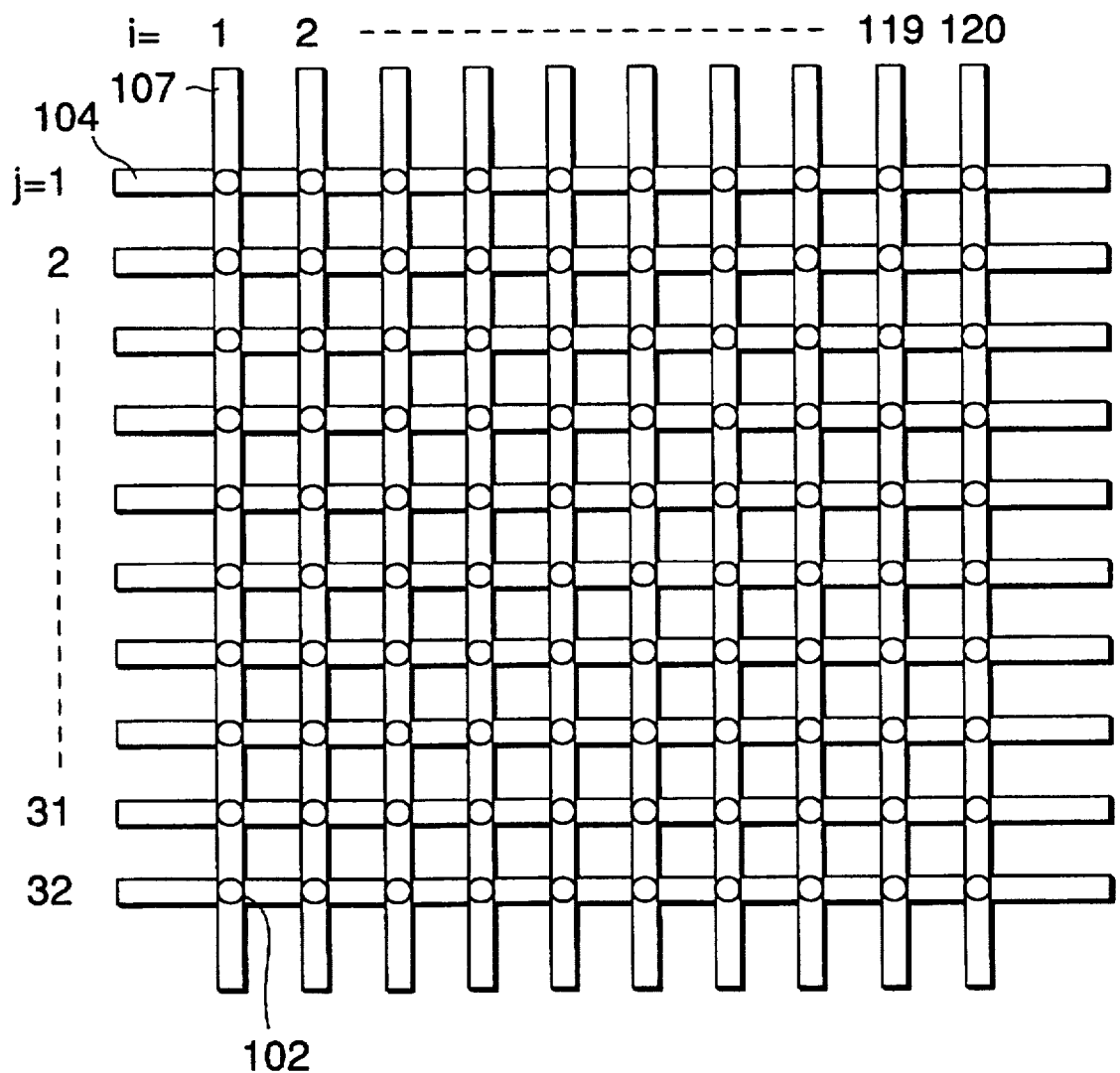
FIG. 12 is a plan view for explaining the conventional two-dimensional surface light emitting laser array in a matrix wiring.

(1) It is assumed that the resistance of one column wiring 107 of the conventional two-dimensional light emission laser array shown in FIG. 12 is $R_1$, that of a single row wiring 104 is $R_2$, the operation current of a single light emission laser 102 is I, the number of the lasers 102 driven on the single row wiring 104 is p and the number of elements driven simultaneously is p'.

(a) the consumed power $W_i$ of the column wiring 107 is $W_1=pI^2R_1$ (b) the consumed power $W_2$ of the row wiring 104

Figure 14:
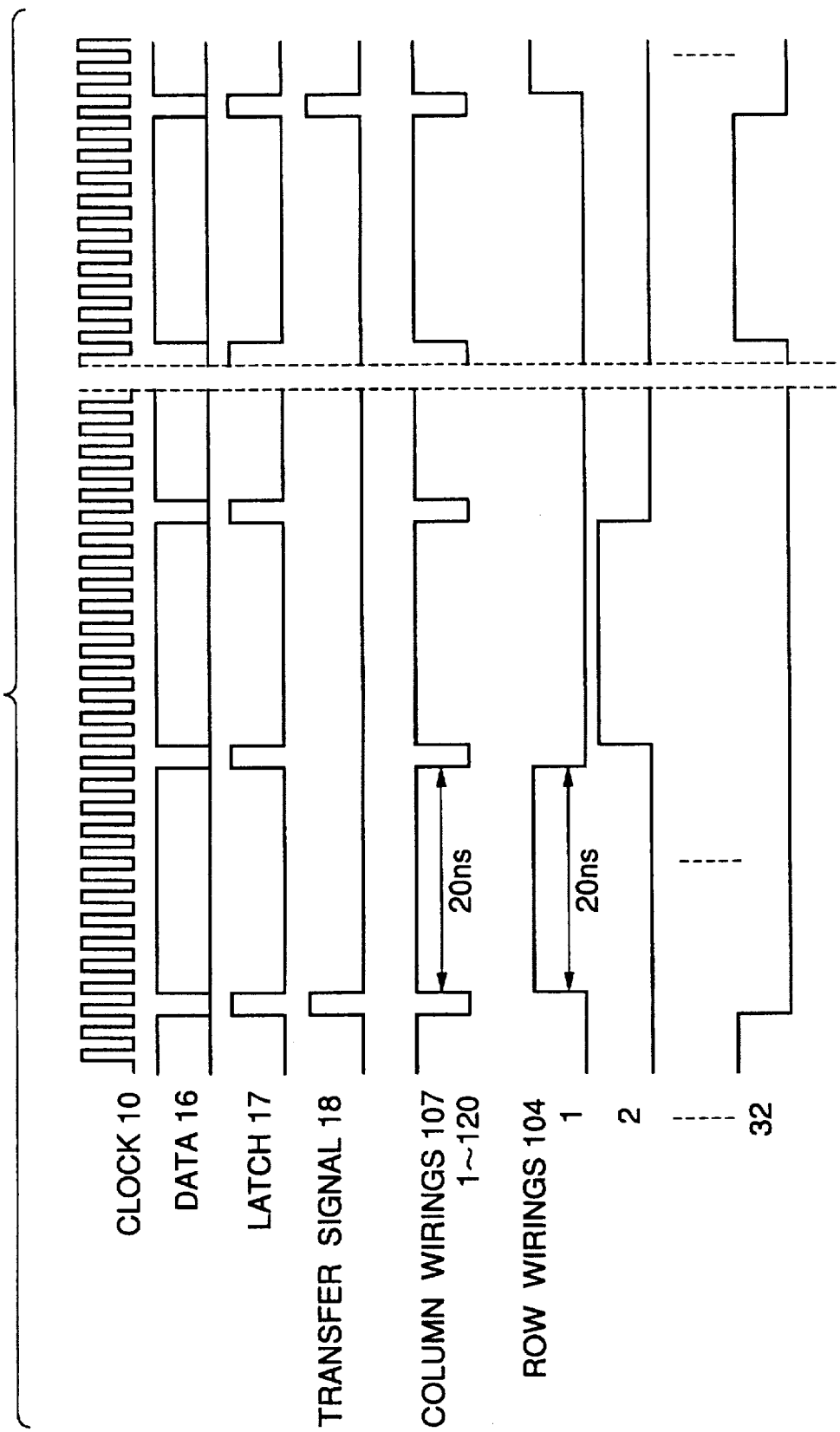
FIG. 14 is a timing chart showing a method of driving the conventional surface light emitting laser array in a matrix wiring (simultaneous driving of all the elements on a single line).
Figure 16:
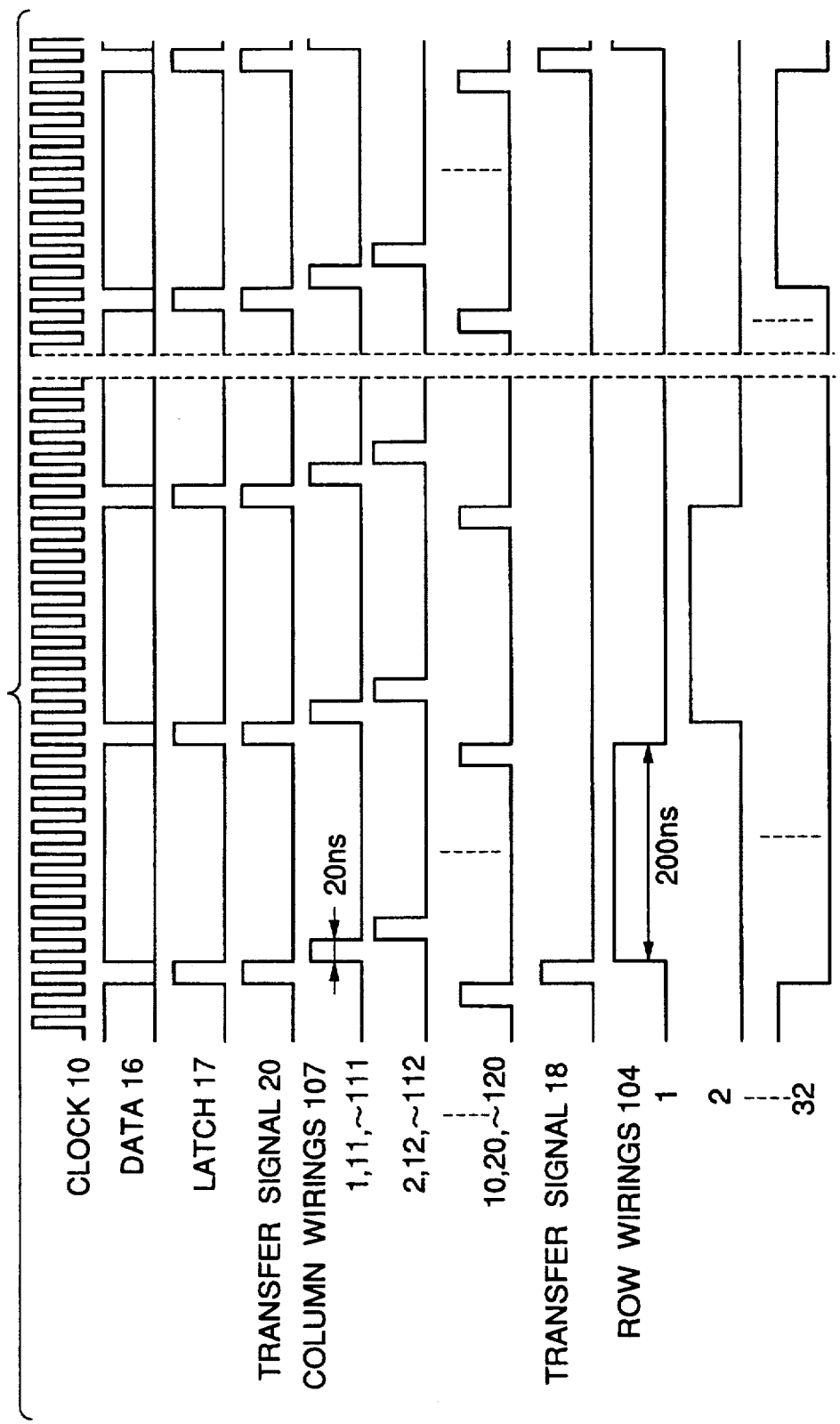
FIG. 16 is a timing chart showing a method for driving the conventional two-dimensional surface light emitting laser array in a matrix wiring (simultaneous driving of spaced elements).

$W_2=(pI)^2 \cdot R_2$ (c) the sum W of the consumed powers $W_1$ and $W_2$ $W=pI^2R_1+(pI)^2 \cdot R_2$ In the driving method shown in FIG. 14, p=p'=120 so that $W=120I^2R_1+(120I)^2 \cdot R_2$ (2) The case of the two-dimensional surface light emitting laser array shown in FIG. 1 according to the present invention.

Assuming that the elements of p'=120 are simultaneously driven for 60 two dimensional surface light emitting lasers for each of two groups, p=60.

(a) the consumed power $W_1$ at the column wirings 107a and 107b $W_1=2×60×I^2×R_1/2$ (b) the consumed $W_2$ at the row wiring $W_2=2×(60×I)^2×R_2$ (c) the sum of the powers $W_1$ and $W_2$ $W=120I^2×R_1/2+(120\ I)^2×R_2/2$ From the above analysis, with the same number of elements operated simultaneously, the two-dimensional surface light emitting laser array shown in FIG. 1 consumes power of ½ of the conventional two-dimensional light emission array of the above (1).

(3) The case of the two-dimensional surface light emitting laser array shown in FIG. 6 according to the present invention (a) In the driving method shown in FIG. 8, p'=240 and p=60.

$W=W_1+W_2$ $=240I^2×R_1/2+4×(60\ I)^2×R_2/2$ $=120I^2×R_1+(120\ I)^2×R_2/2$

From the above analysis, with the number of simultaneously driven elements doubled, the row wiring of the two-dimensional surface light emitting laser array shown in FIG. 6 consumes power of ½ of the conventional two-dimensional light emission array of the above (1).

(b) In the driving method shown in FIG. 9, when 30 (thirty) surface light emission lasers for each of four groups are driven, p'=120 and p=30.

$W=W_1+W_2$ $=120I^2×R_1/2+4×(30\ I)^2×R_2/2$ $=120I^2×R_1/2+(120\ I)^2×R_2/8$

From the above analysis, with the same number of simultaneously driven elements, the two-dimensional surface light emitting laser array shown in FIG. 6 consumes power of ½ at the column wiring and of ⅛ at the row wiring as compared with those of the conventional two-dimensional surface light emitting laser array of the above (1).

As described above, in the two dimensional surface light emitting element array in a matrix wiring according to the present invention, at least one of row wirings and column wirings are divided into plural groups so that the time required to obtain the light emission pattern of one frame can be shortened, and the heat generation due to wirings is reduced to suppress the surface light emitting elements from being deteriorated.

The driving method and device of the two dimensional surface light emitting element array in a matrix wiring according to the present invention permit the surface light emitting elements to be driven spaced from each other so that influence on heat generation from the adjacent surface light emitting elements can be reduced.

What is claimed is:

1. A two-dimensional surface light emitting element array comprising:

a wiring matrix having a first side and a second side, said second side being transverse to said first side, said matrix including a first wiring group of plural electrodes arranged in a first wiring direction from said first side toward a side opposite said first side and in parallel to each other;

a second wiring group of plural electrodes arranged in a second wiring direction from said second side toward a side opposite said second side and in parallel to each other, said second wiring group of plural electrodes crossing the first wiring group;

plural surface light emitting elements connected to respective electrodes of said first wiring group and said second wiring group, and arranged two-dimensionally at intersecting points of said first wiring group and said second wiring group, wherein said first wiring group includes a first subset of plural electrodes and a second subset of plural electrodes, each electrode of said first subset having a first end adjacent said first side and a second end opposite said first end in said first wiring direction, each electrode of said second subset having a first end facing said second end of a corresponding electrode of said first subset and a second end opposite said first end of said second subset in said first wiring direction, each electrode of said second subset being coaxial with the corresponding electrode of said first subset in said first wiring direction such that each second end of said electrodes of said first subset is electrically separate from and out of contact with each first end of said electrodes of said second subset, wherein a first gap is provided in said first wiring direction between each second end of said first subset and each first end of said second subset; and the electrodes of one of said electrode groups are provided with an external connection section for driving said surface light emitting elements connected to the electrodes individually from the surface light emitting elements connected to the electrodes of the remaining electrode group.

2. The two-dimensional surface light emitting element array of claim 1, wherein said second wiring group includes a third subset of plural electrodes and a fourth subset of electrodes, each electrode of said third subset having a first end adjacent said second side and a second end opposite said first end in said second wiring direction, each electrode of said fourth subset having a first end facing said second end of a corresponding electrode of said third subset and a second end opposite said first end of said fourth subset in said second wiring direction, each electrode of said fourth subset being coaxial with the corresponding electrode of said third subset in said second wiring direction such that each second end of said electrodes of said third subset is electrically separate from and out of contact with each first end of said electrodes of said fourth subset, wherein a second gap is provided in said second wiring direction between each second end of said third subset and each first end of said fourth subset so that said first gap and said second gap are transverse; and the electrodes of one of said electrode groups are provided with an external connection section for driving said surface light emitting elements connected to the electrodes individually from the surface light emitting elements connected to the electrodes of the remaining electrode groups.

3. The two-dimensional surface light emitting element array of claim 1, wherein the electrodes of said first wiring group and said second wiring group and said plural surface light emitting elements are formed monolithically.

4. An image recording device using a two-dimensional surface light emitting element array as a light source in which said two-dimensional surface light emitting element array comprises:

a writing matrix having a first side and a second side, said second side being transverse to said first side, said matrix including a first wiring group of plural electrodes arranged in a first wiring direction from said first side toward a side opposite said first side and in parallel to each other;

a second wiring group of plural electrodes arranged in a second wiring direction from said second side toward a side opposite said second side and in parallel to each other, said second wiring group of plural electrodes crossing the first wiring group;

plural surface light emitting elements connected to respective electrodes of said first wiring group and said second wiring group and arranged two-dimensionally at intersecting points of said first wiring group and said second wiring group;

driving means for supplying a signal to said electrode groups through an external connection section, wherein said first wiring group includes a first subset of plural electrodes and a second subset of plural electrodes, each electrode of said first subset having a first end adjacent said first side and a second end opposite said first end in said first wiring direction, each electrode of said second subset having a first end facing said second end of a corresponding electrode of said first subset and a second end opposite said first end of said second subset in said first wiring direction, each electrode of said second subset being coaxial with the corresponding electrode of said first subset in said first wiring direction such that each second end of said electrodes of said first subset is electrically separate from and out of contact with each first end of said electrodes of said second subset, wherein a gap is provided in said first wiring direction between each second end of said first subset and each first end of said second subset; and the electrodes of one of said electrode groups are provided with an external connection section for driving said surface light emitting elements connected to the electrodes individually from the surface light emitting elements connected to the electrodes of the remaining electrode group.

5. The image recording device of claim 4, wherein said driving circuit serves to supply a signal to cause the surface light emitting elements connected to different ones of said electrode groups to emit light simultaneously.

6. The image recording device of claim 4, wherein said driving circuit serves to supply a signal to cause the surface light emitting elements connected the same one of said electrode groups to emit light simultaneously.

7. A method of driving a two dimensional surface light emitting element array, comprising the steps of:

separating electrically first or second wiring groups of plural electrodes of a two-dimensional surface light emitting element array into at least first and second subsets of plural electrodes, wherein said first wiring group of plural electrodes is arranged in a first wiring direction from a first side toward a side opposite said first side and in parallel to each other and said second wiring group of plural electrodes is arranged in a second wiring direction from a second side toward a side opposite said second side and in parallel to each other, said second side being transverse to said first side and said second wiring group of plural electrodes crossing said first wiring group, wherein said first wiring group includes said first subset of plural electrodes and said second subset of plural electrodes, each electrode of said first subset having a first end adjacent said first side and a second end opposite said first end in said first wiring direction, each electrode of said second subset having a first end facing said second end of a corresponding electrode of said first subset and a second end opposite said first end of said second subset in said first wiring direction, each electrode of said second subset being coaxial with the corresponding electrode of said first subset in said first wiring direction such that each second end of said electrodes of said first subset is electrically separate from and out of contact with each first end of said electrodes of said second subset, wherein a gap is provided in said first wiring direction between each second end of said first subset and each first end of said second subset;

supplying data of plural divided light emission patterns resulting from division of a light emission pattern to said first and second subsets of plural electrodes of said first or second wiring groups; and when said data are supplied to said first and second subsets of plural electrodes of said first or second wiring groups, supplying a wiring signal to each one wiring selected respectively from plural first or second wiring groups corresponding to said first and second subsets of plural electrodes of said first or second wiring group.

8. A device for driving a two-dimensional surface light emitting element array comprising:

a two-dimensional surface light emitting element array with separated electrically row or column wiring groups separated into at least two wiring groups, wherein a first wiring group of plural electrodes is arranged in a first wiring direction from a first side toward a side opposite said first side and in parallel to each other and a second wiring group of plural electrodes is arranged in a second wiring direction from a second side toward a side opposite said second side and in parallel to each other, said second side being transverse to said first side and said second wiring group crossing said first wiring group, wherein said first wiring group includes a first subset of plural electrodes and a second subset of plural electrodes, each electrode of said first subset having a first end adjacent said first side and a second end opposite said first end in said first wiring direction, each electrode of said second subset having a first end facing said second end of a corresponding electrode of said first subset and a second end opposite said first end of said second subset in said first wiring direction, each electrode of said second subset of said wiring group being coaxial with the corresponding electrode of said first subset in said first wiring direction such that each second end of said electrodes of said first subset is electrically separate from and out of contact with each first end of said electrodes of said second subset, wherein a gap is provided in said first wiring direction between each second end of said first subset and each first end of said second subset;

plural driver circuits corresponding to said plural separated electrically row or column wiring groups for driving said plural separated electrically rows or column wiring groups in accordance with a surface light emitting pattern; and plural selector circuits for sequentially selecting each one wiring from plural row or column wiring groups corresponding to said plural separated electrically row or column wiring groups.

* * * * *